(12) United States Patent
Mao et al.

(10) Patent No.: US 9,818,791 B1
(45) Date of Patent: Nov. 14, 2017

(54) STACKED IMAGE SENSOR

(71) Applicant: OMNIVISION TECHNOLOGIES, INC., Santa Clara, CA (US)

(72) Inventors: Duli Mao, Sunnyvale, CA (US);
Zhiqiang Lin, San Jose, CA (US);
Keiji Mabuchi, Los Altos, CA (US);
Gang Chen, San Jose, CA (US); Dyson H. Tai, San Jose, CA (US); Bill Phan, San Jose, CA (US); Oray Orkun Cellek, Santa Cruz, CA (US); Dajiang Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/285,408

(22) Filed: Oct. 4, 2016

(51) Int. Cl.
*H01L 27/146* (2006.01)
*H04N 5/378* (2011.01)
*H04N 5/235* (2006.01)

(52) U.S. Cl.
CPC .... *H01L 27/14647* (2013.01); *H01L 27/1463* (2013.01); *H01L 27/1464* (2013.01); *H01L 27/1469* (2013.01); *H01L 27/14621* (2013.01); *H01L 27/14623* (2013.01); *H01L 27/14632* (2013.01); *H01L 27/14634* (2013.01); *H01L 27/14636* (2013.01); *H01L 27/14685* (2013.01); *H01L 27/14687* (2013.01); *H04N 5/2355* (2013.01); *H04N 5/378* (2013.01)

(58) Field of Classification Search
CPC H04N 5/335; H04N 5/2253; H01L 23/53238;
H01L 23/552; H01L 23/53228; H01L 23/53295; H01L 27/14643; H01L 27/14656; H01L 27/14616; H01L 27/14612; H01L 27/14623; H01L 27/14636
See application file for complete search history.

(56) References Cited

U.S. PATENT DOCUMENTS

| | | | |
|---|---|---|---|
| 7,345,703 B2 | 3/2008 | Lee | |
| 7,667,749 B2 | 2/2010 | Han | |
| 8,698,265 B2 | 4/2014 | Yoon | |
| 8,773,562 B1* | 7/2014 | Fan | H01L 27/14643 250/208.1 |
| 2013/0200396 A1* | 8/2013 | Zheng | H01L 27/14623 257/80 |

(Continued)

*Primary Examiner* — Kelly L Jerabek
(74) *Attorney, Agent, or Firm* — Christensen O'Connor Johnson Kindness PLLC

(57) ABSTRACT

A stacked image sensor includes a first plurality of photodiodes, including a first photodiode and a second photodiode, disposed in a first semiconductor material. A thickness of the first semiconductor material proximate to the first photodiode is less than the thickness of the first semiconductor material proximate to the second photodiode. A second plurality of photodiodes is disposed in a second semiconductor material. The second plurality of photodiodes is optically aligned with the first plurality of photodiodes. An interconnect layer is disposed between the first semiconductor material and the second semiconductor material. The interconnect layer includes an optical shield disposed between the second photodiode and a third photodiode included in the second plurality of photodiodes. The optical shield prevents a first portion of image light from reaching the third photodiode.

20 Claims, 4 Drawing Sheets

(56) References Cited

U.S. PATENT DOCUMENTS

| | | | |
|---|---|---|---|
| 2014/0055654 A1* | 2/2014 | Borthakur | H04N 5/335 348/302 |
| 2014/0103411 A1* | 4/2014 | Dai | H01L 27/14609 257/292 |
| 2015/0084098 A1* | 3/2015 | Choi | H01L 27/14612 257/230 |
| 2016/0005782 A1* | 1/2016 | Aoki | H01L 23/552 257/435 |
| 2016/0300879 A1* | 10/2016 | Harada | H01L 31/10 |
| 2017/0117310 A1* | 4/2017 | Tatani | H01L 27/14605 |
| 2017/0221954 A1* | 8/2017 | Madurawe | H01L 27/14636 |

* cited by examiner

US 9,818,791 B1

STACKED IMAGE SENSOR

TECHNICAL FIELD

This disclosure relates generally to image sensors, and in particular but not exclusively, relates to stacked image sensors.

BACKGROUND INFORMATION

Image sensors have become ubiquitous. They are widely used in digital still cameras, cellular phones, security cameras, as well as, medical, automobile, and other applications. The device architecture of image sensors has continued to advance at a great pace due to increasing demands for higher resolution, lower power consumption, increased dynamic range, etc. These demands have also encouraged the further miniaturization and integration of image sensors into these devices.

The typical image sensor operates as follows. Image light from an external scene is incident on the image sensor. The image sensor includes a plurality of photosensitive elements such that each photosensitive element absorbs a portion of incident image light representing a portion of the external scene to be captured. Photosensitive elements included in the image sensor, such as photodiodes, generate image charge upon absorption of the image light. The amount of image charge generated is proportional to the intensity of the image light. The image charge may be used to generate an image based on the image light.

A parameter for image sensors is dynamic range. The dynamic range of an image sensor describes the ratio between the maximum and minimum measurable image light intensities. For example, an image sensor with a low dynamic range may only be able to generate images under a very specific image light intensity, while an image sensor with a high dynamic range may be able to generate images under a variety of image light intensities. A high dynamic image sensor is desirable for most applications, especially for automotive and security applications which require image capture under a variety of image light conditions.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
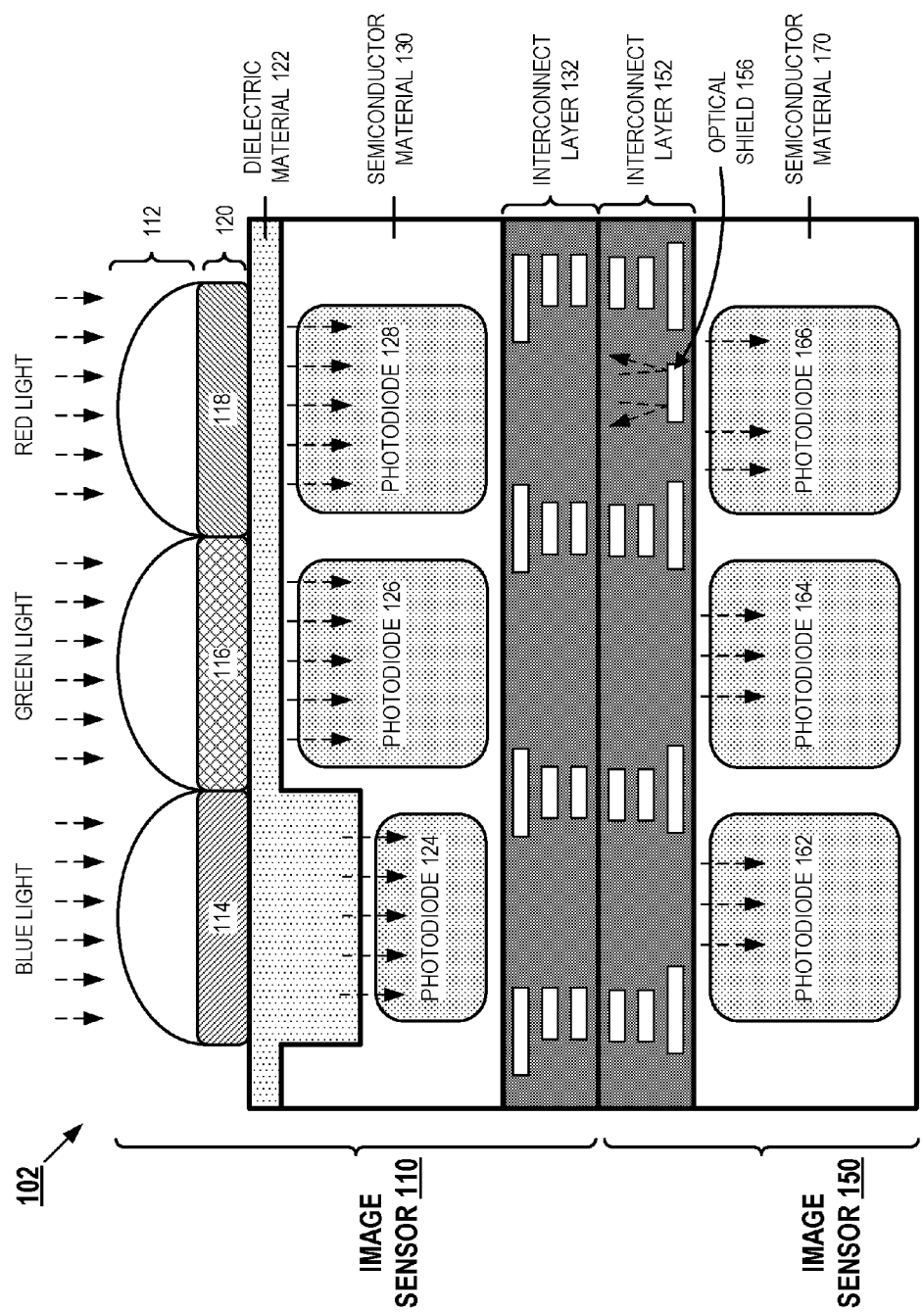
FIG. 1A is a cross sectional illustration of an example stacked image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a stacked image sensor are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A is a cross sectional illustration of an example stacked image sensor 102. Stacked image sensor 102 includes image sensor 110 and image sensor 150. Image sensor 110 includes a plurality of microlenses 112, color filters 120, dielectric material 122, a plurality of photodiodes (including photodiodes 124, 126, and 128), semiconductor material 130, and interconnect layer 132. Image sensor 150 includes interconnect layer 152, optical shield 156, a plurality of photodiodes (including photodiodes 162, 164, and 166), and semiconductor material 170.

As illustrated, stacked image sensor 102 includes image sensor 110 and image sensor 150. Image sensor 110 includes a first plurality of photodiodes (including photodiodes 124, 126, and 128) disposed in semiconductor material 130. The thickness of semiconductor material 130 proximate to photodiode 124 is less than the thickness of semiconductor material 130 proximate to photodiode 128. In one example, the thickness of semiconductor material 130 proximate to photodiode 124 is half the thickness of semiconductor material 130 proximate to photodiode 128. Image sensor 150 includes a second plurality of photodiodes (including photodiodes 162, 164, and 166) disposed in semiconductor material 170. The first plurality of photodiodes and second plurality of photodiodes are optically aligned such that each photodiode in the first plurality of photodiodes is optically aligned with a respective photodiode in the second plurality of photodiodes. The optical alignment of photodiodes allows for respective photodiodes in the first and second plurality of photodiodes to absorb image light representing the same portion of an external scene. In the illustrated example photodiode 124 is optically aligned with photodiode 162, photodiode 126 is optically aligned with photodiode 164, and photodiode 128 is optically aligned with photodiode 166. For example, image light representing a same portion of an external scene may be partially absorbed by photodiode 124. Unabsorbed image light representing the same portion of an external scene may propagate through photodiode 124 and be absorbed by photodiode 162.

Disposed between semiconductor material 130 and semiconductor material 170 is an interconnect layer. The interconnect layer may be a single layer or may include interconnect layer 132 bonded to interconnect layer 152. Disposed between photodiode 128 and photodiode 166 is an optical shield 156 to prevent a portion of image light from reaching photodiode 166.

As illustrated, image sensor 110 of stacked image sensor 102 may include a plurality of microlenses 112 to direct image light towards each photodiode in the plurality of photodiodes. Color filters 120 may be disposed between the plurality of microlenses 112 and semiconductor material 130. In one example, the color filters 112 may include blue, green, and red color filters which may be arranged into a Bayer pattern, EXR pattern, X-trans pattern, or the like. However, in a different or the same example, the color filters 112 may include infrared filters, ultraviolet filters, or other light filters that isolate portions of the electromagnetic spectrum. Dielectric material 122 may be disposed between color filters 112 and semiconductor material 130. Semiconductor material 130 may be disposed between dielectric material 122 and interconnect layer 132. The combined thickness of semiconductor material 130 and dielectric material 122 may be uniform such that the dielectric material fills in the recess caused by the difference in thickness of semiconductor material 130 proximate to photodiode 124 and photodiode 126. In one example, a metal grid to direct image light towards the plurality of photodiodes may be disposed in dielectric material 122.

In the illustrated example, stacked image sensor 102 is a high dynamic range image sensor of the visible light spectrum. Color filters 120 include blue color filter 114 optically aligned with photodiodes 124 and 162, green color filter 116 optically aligned with photodiodes 126 and 164, and red color filter 118 optically aligned with photodiodes 128 and 166. In one example the lateral dimensions of the color filters is the same as the lateral dimensions of the plurality of photodiodes in semiconductor material 130 and semiconductor material 170. Photogenerated image charge representing absorbed blue light from photodiodes 124 and 162, green light from photodiodes 126 and 164, and red light from photodiodes 128 and 166 of stacked image sensor 102 may be combined to obtain full color spectrum information of incident image light. Image sensor 110 may be a backside illuminated image sensor to provide a high sensitivity to image light under low image light conditions or normal image light conditions. Image sensor 150 may be a front side illuminated image sensor and is disposed to receive and absorb a portion of unabsorbed incident light that propagates through image sensor 110. Image sensor 150 may provide further enhanced dynamic range of stacked image sensor 102 by providing additional image light information under high image light conditions.

For example, under high image light conditions, the image charge photogenerated by a photodiode in the plurality of photodiodes in semiconductor material 130 may saturate. However, stacked image sensor 102 further includes image sensor 150 disposed to receive incident image light that propagates through image sensor 110. Image sensor 150 may be ten times less sensitive to image light than image sensor 110. Therefore, the intensity of image light that saturates the plurality of photodiodes in image sensor 110 is less than the intensity of image light that saturates the plurality of photodiodes disposed in image sensor 150. Stacked image sensor 102 may have a higher dynamic range than the individual dynamic range of either image sensor 110 or image sensor 150.

In the illustrated embodiment, semiconductor material 130 and semiconductor material 170 are silicon. Since blue light propagates through a lesser thickness of silicon than green or red light, the thickness of semiconductor material 130 proximate to photodiode 124 (which may receive blue light), is less than the thickness of semiconductor material 130 proximate to photodiode 126 (which may receive green light). Consequently, the sensitivity of photodiode 162 to blue image light is substantially the same as the sensitivity of photodiode 164 to green image light. Similarly, since red light propagates through a greater thickness of silicon than green or blue light, an optical shield 156 may be disposed between semiconductor material 130 and semiconductor material 170 to prevent a portion of image light from reaching photodiode 166 (which may receive red light). The optical shield 156 may be disposed in interconnect layer 132, interconnect layer 152, or disposed as a separate layer between semiconductor material 130 and semiconductor material 170. The optical shield 156 may absorb, reflect, or refract image light such that a portion of the image light is prevented from reaching photodiode 166. Alternatively, or additionally, the geometric size of the optical shield 156 may be adjusted as another avenue to control the portion of blocked image light. For example, the lateral dimension of the optical shield 156 may be less than the lateral dimensions of photodiode 166. Thus the sensitivity of photodiode 166 to red image light is substantially the same as the sensitivity of photodiode 164 to green image light. By controlling the thickness of semiconductor material 130 and including the optical shield 156, image sensor 150 has substantially the same sensitivity to red image light, green image light, and blue image light.

Figure 1B:
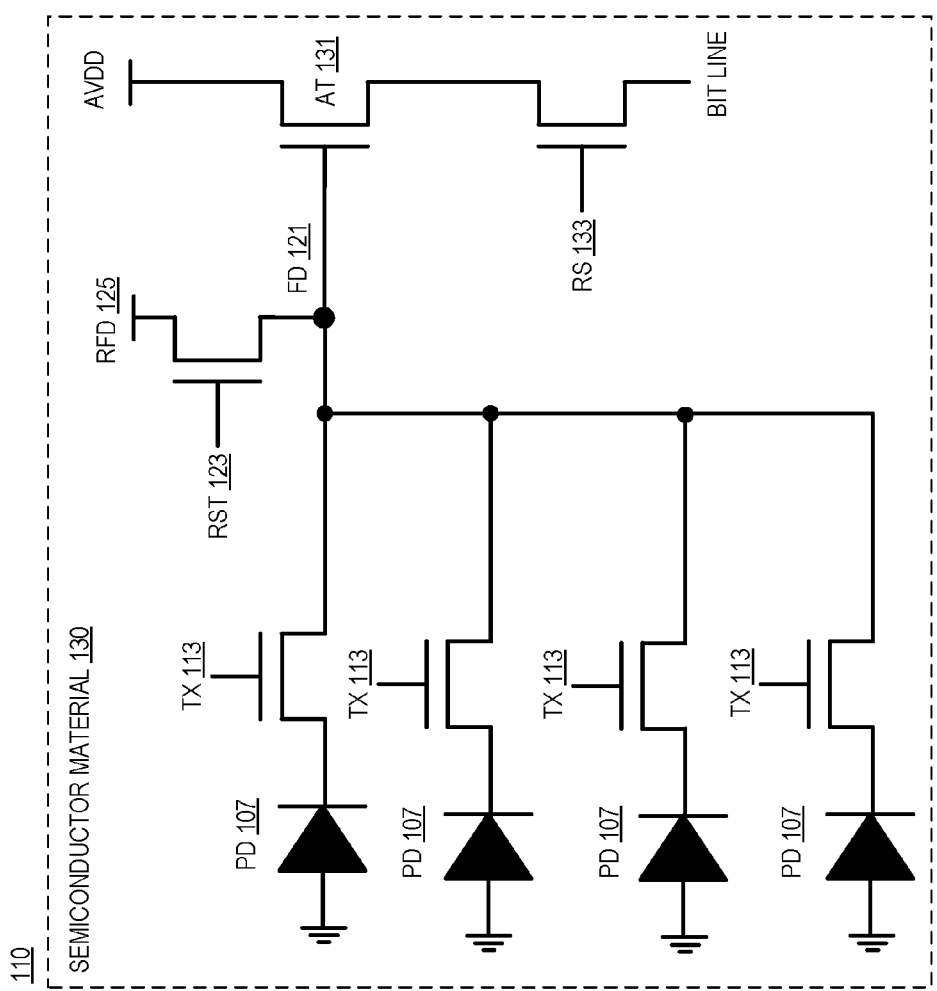
FIG. 1B is an example circuit diagram of the stacked image sensor in FIG. 1A, in accordance with the teachings of the present invention.

FIG. 1B is a circuit diagram of image sensor 110 in FIG. 1A. The discussion of FIG. 1B may refer back to elements of FIG. 1A to further clarify the operation of image sensor 110. As illustrated in FIG. 1B, image sensor 110 includes: semiconductor material 130, a plurality of photodiodes 107 (including for example photodiodes 124, 126, and 128 of FIG. 1A), a plurality of transfer gates 113, floating diffusion 121, reset transistor 123, amplifier transistor 131, and row select transistor 133. The plurality of photodiodes 107 is disposed in semiconductor material 130 to accumulate image charge photogenerated in response to incident image light directed into plurality of photodiodes 107. In one example, semiconductor material 130 may include silicon, but may include other suitable semiconductor materials and dopant atoms. Plurality of transfer gates 113 is also disposed in semiconductor material 130, and individual transfer gates 113 in plurality of transfer gates 113 are coupled to individual photodiodes 107 in plurality of photodiodes 107. Floating diffusion 121 is disposed in semiconductor material 130, and floating diffusion 121 is coupled to the plurality of transfer gates 113 to receive image charge from plurality of photodiodes 107 in response to a transfer signal sequentially applied to a control terminal of each individual transfer gate 113. In other words, in the depicted example, a transfer signal is applied to the control terminal of the top transfer gate 113, then a transfer signal is applied to the control terminal of the second-from-the-top transfer gate 113, etc. Reset transistor 123 is coupled to floating diffusion 121 to extract the image charge from floating diffusion 121. Further, amplifier transistor 131 is coupled to floating diffusion 121, and row select transistor 133 is coupled between an output of amplifier transistor 131 and a bit line output. In one example, amplifier transistor 131 includes a source follower coupled transistor.

Although not depicted in FIG. 1A, readout circuitry may be at least partially disposed in interconnect layer 132. For example, transfer gates 113 and floating diffusion 121 may be disposed at least partially in interconnect layer 132 to readout image charge from the plurality of photodiodes disposed in semiconductor material 130. Alternatively or additionally, analogous elements as depicted in FIG. 1B may also be included in image sensor 150. For example, readout circuitry may be at least partially disposed in interconnect layer 152 to readout image charge from the plurality of photodiodes disposed in semiconductor material 170.

In the depicted example, plurality of photodiodes 107 includes four photodiodes 107 coupled to floating diffusion 121 through transfer gates 113. However, in a different example, any number of photodiodes 107 may be coupled to floating diffusion 121 including two, six, and eight photodiodes 107. In the depicted example, the four photodiodes 107 include two photodiodes 107 disposed to absorb green image light, one photodiode 107 disposed to absorb blue image light, and one photodiode 107 disposed to absorb red image light.

Figure 2:
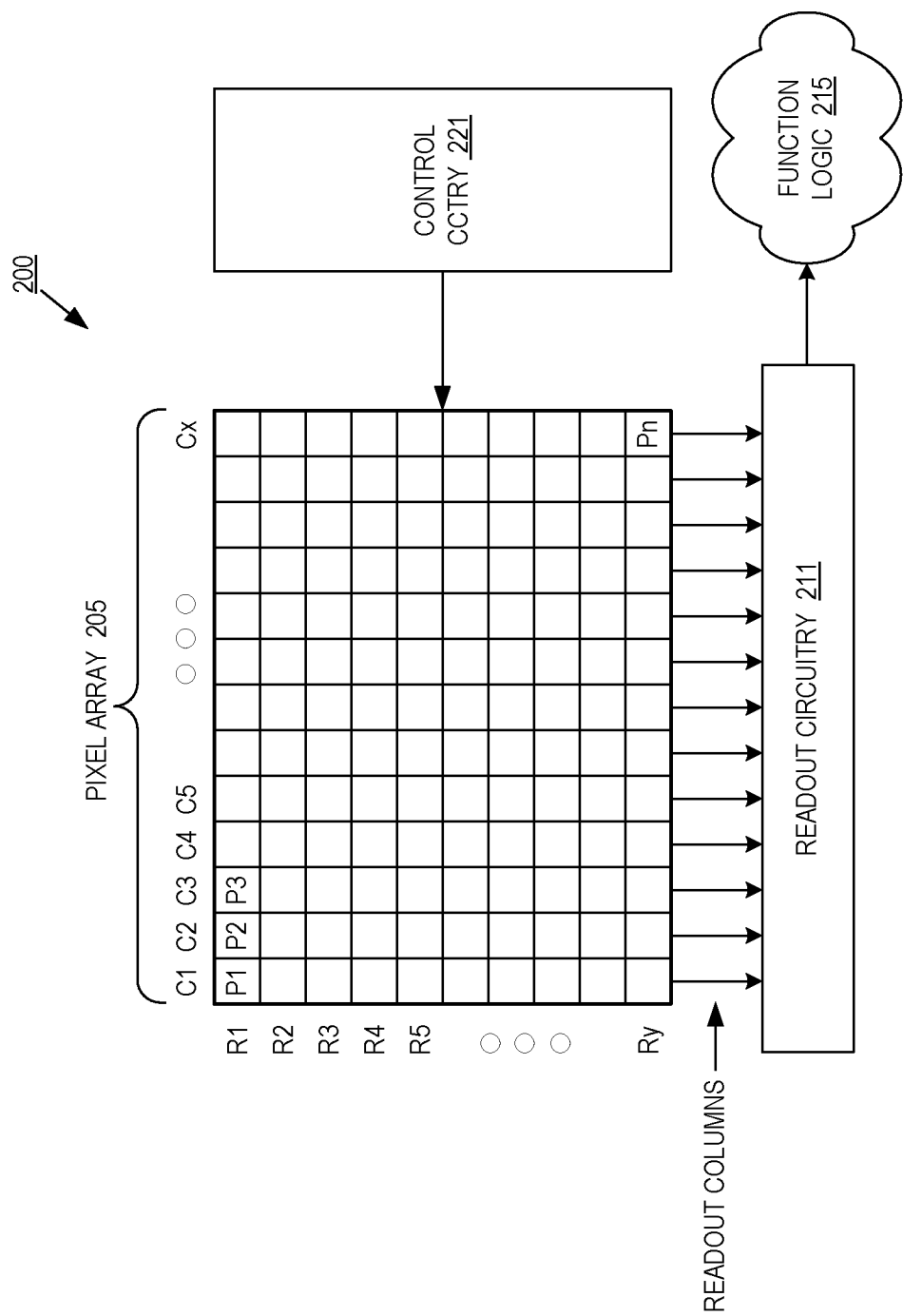
FIG. 2 is a block diagram illustrating one example of an imaging system including the image sensor of FIG. 1A, in accordance with the teachings of the present invention.

FIG. 2 is a block diagram illustrating one example of imaging system 200 including the image sensor of FIG. 1A. The discussion of FIG. 2 may refer back to elements of FIG. 1A to further clarify the operation of stacked image sensor 102. Imaging system 200 includes pixel array 205, control circuitry 221, readout circuitry 211, and function logic 215. In one example, pixel array 205 is a two-dimensional (2D) array of stacked photodiodes, or image sensor pixels (e.g., pixels P1, P2 . . . , Pn) including plurality of photodiodes disposed in semiconductor material 130 and plurality of photodiodes disposed in semiconductor material 170. As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. Readout circuitry 211 may include a first readout circuitry at least partially disposed in interconnect layer 132 and a second readout circuitry at least partially disposed in interconnect layer 152. First readout circuitry may be coupled to read out first image data from a first image charge photogenerated by the plurality of photodiodes disposed in semiconductor material 130 and second readout circuitry may be coupled to read out second image data from a second image charge photogenerated by the plurality of photodiodes disposed in semiconductor material 170. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously. In one example, stacked image sensor is configured to capture both high dynamic range images and low dynamic range images. For example, the stacked image sensor may be configured to capture both a bright image region and a dark image region with high fidelity. In another example, function logic is coupled to the first readout circuitry and the second readout circuitry. In response to receiving the first image data and the second image data, the function logic converts the first image data and the second image data into a data set corresponding to a high dynamic range image.

In one example, control circuitry 221 is coupled to pixel array 205 to control operation of the plurality of photodiodes in pixel array 205. Control circuitry 221 may include a first control circuitry at least partially disposed in interconnect layer 132 and a second control circuitry at least partially disposed in interconnect layer 152. The first control circuitry controls operation of the plurality of photodiodes disposed in semiconductor material 130 and the second control circuitry controls operation of the plurality of photodiodes disposed in semiconductor material 170. For example, control circuitry 221 may generate a shutter signal for controlling image acquisition. In one example, the shutter signal is a global shutter signal for simultaneously enabling all pixels within pixel array 205 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3:
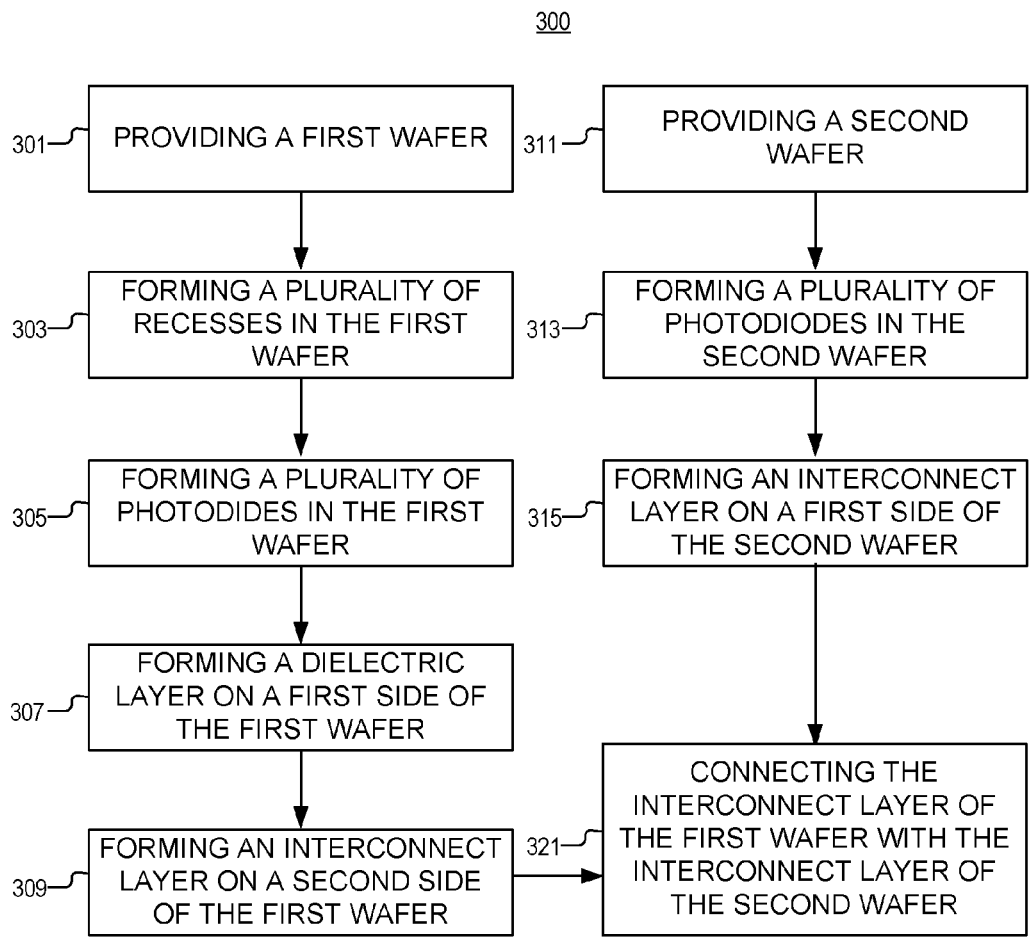
FIG. 3 illustrates an example method for forming the stacked image sensor of FIG. 1A, in accordance with the teachings of the present invention.

FIG. 3 illustrates an example method 300 for forming the stacked image sensor of FIG. 1A. The order in which some or all process blocks appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain process blocks in order to avoid obscuring certain aspects. Alternatively, method 300 may include additional process blocks that may not be necessary in some embodiments/examples of the disclosure.

Process blocks 301-309 illustrates forming image sensor 110 of stacked image sensor 102. Process block 301 illustrates providing a first wafer. In one example, the wafer may be a silicon wafer.

Process block 303 shows forming a plurality of recesses in the first wafer. In one example, the silicon wafer may be etched using a plasma etchant such as $CF_4$. Other methods of forming recesses such as wet chemical etching, plasma etching, ion milling, sputtering, etc. may be used. In one example, the silicon with recesses is 1.5 μm thick while the silicon without recesses is 2-3 μm thick.

Process block 305 depicts forming a plurality of photodiodes in the semiconductor material via ion implantation. However in other examples, the plurality of photodiodes is formed by dopant inclusion during semiconductor material growth (e.g., incorporating arsenic-based gasses in a chemical vapor deposition semiconductor growth process).

Process block 307 shows forming a dielectric layer on a first side of the first wafer and the combined thickness of the dielectric layer and the wafer is uniform. Dielectric layer may be grown via thermal oxidation, chemical vapor deposition, or other means. The dielectric layer may include oxides such as silicon oxide ($SiO_2$), hafnium oxide ($HfO_2$), or the like. Other dielectrics, such as solution processable organics like poly(methyl methacrylate) (PMMA), polystyrene, etc. may be used. Additionally, one skilled in the relevant art, will recognize that any dielectric which meets the requisite resistivity may be used. Disposed in dielectric layer may also be a metal grid for guiding light towards the plurality of photodiodes.

Block 309 depicts forming an interconnect layer on a second side of the first wafer. The first wafer is disposed between the interconnect layer and the dielectric layer. At least partially disposed in interconnect layer is readout circuitry coupled to extract image charge from the plurality of photodiodes (as illustrated in FIG. 1A). Furthermore, process block 309 illustrates forming an optical stack. The optical stack may include color filters, microlenses and other secondary optical structures to optimize image acquisition by the image sensor.

Process blocks 311-315 illustrates forming image sensor 150 of stacked image sensor 102. Process block 311 illustrates providing a second wafer. In one example, the wafer may be a silicon wafer.

Process block 313 depicts forming a plurality of photodiodes in the semiconductor material via ion implantation. However in other examples, the plurality of photodiodes is formed by dopant inclusion during semiconductor material growth (e.g., incorporating arsenic-based gasses in a chemical vapor deposition semiconductor growth process).

Process block 315 illustrates forming an interconnect layer on a first side of the second wafer. At least partially disposed in interconnect layer is readout circuitry coupled to extract image charge from the plurality of photodiodes (as illustrated in FIG. 1A). Furthermore, process block 315 depicts forming an optical shield. Optical shield may be disposed in interconnect layer or may be disposed as a separate layer proximate to interconnect layer.

Process block 321 depicts forming stacked image sensor 102. Interconnect layer of image sensor 110 may be stacked on the interconnect layer of image sensor 150 so incident image light propagates through image sensor 110 to image sensor 150. The first wafer and the second wafer may be bonded together at an interface of the interconnect layer of image sensor 110 and the interconnect layer of image sensor 150. Alternatively, the first wafer and the second wafer may be connected by other means known by one of ordinary skill in the art.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A stacked image sensor, comprising:
a first plurality of photodiodes, including a first photodiode and a second photodiode, disposed in a first semiconductor material, wherein a thickness of the first semiconductor material proximate to the first photodiode is less than the thickness of the first semiconductor material proximate to the second photodiode;
a second plurality of photodiodes disposed in a second semiconductor material, wherein the second plurality of photodiodes is optically aligned with the first plurality of photodiodes; and
an interconnect layer disposed between the first semiconductor material and the second semiconductor material, wherein the interconnect layer includes an optical shield disposed between the second photodiode and a third photodiode included in the second plurality of photodiodes, and wherein the optical shield prevents a first portion of image light from reaching the third photodiode.

2. The stacked image sensor of claim 1, wherein the second plurality of photodiodes further includes a fourth photodiode optically aligned with the first photodiode, and wherein the first photodiode and the fourth photodiode absorb blue light in the image light.

3. The stacked image sensor of claim 2, wherein the second photodiode is optically aligned with the third photodiode, and wherein the second photodiode and third photodiode absorb red light in the image light.

4. The stacked image sensor of claim 3, wherein the first plurality of photodiodes further includes a fifth photodiode and the second plurality of photodiodes further includes a sixth photodiode, wherein the fifth photodiode is optically aligned with the sixth photodiode, and wherein the fifth photodiode and the sixth photodiode absorb green light in the image light.

5. The stacked image sensor of claim 4, further comprising a blue color filter optically aligned with the first photodiode, a red color filter optically aligned with the second photodiode, and a green color filter optically aligned with the fifth photodiode.

6. The stacked image sensor of claim 1, wherein a first intensity of the image light saturates image charge in the first plurality of photodiodes, wherein a second intensity of the image light saturates image charge in the second plurality of photodiodes, and wherein the first intensity is less than the second intensity.

7. The stacked image sensor of claim 1, further comprising a dielectric material, wherein the first semiconductor material is disposed between the dielectric material and the interconnect layer, and wherein a combined thickness of the first semiconductor material and the dielectric material is uniform.

8. The stacked image sensor of claim 1, wherein the interconnect layer further includes a first interconnect layer and a second interconnect layer, wherein the first interconnect layer is disposed between the first semiconductor material and the second interconnect layer, and wherein the second interconnect layer is disposed between the first interconnect layer and the second semiconductor material.

9. The stacked image sensor of claim 8, wherein the optical shield is disposed in at least one of the first interconnect layer or in the second interconnect layer.

10. The stacked image sensor of claim 1, wherein the stacked image sensor is configured to capture both a bright image region and a dark image region with a high fidelity.

11. An imaging system, comprising:
- a first plurality of photodiodes disposed in a first semiconductor wafer including a first photodiode and a second photodiode, wherein a thickness of the first semiconductor wafer proximate to the first photodiode is less than the thickness of the first semiconductor wafer proximate to the second photodiode;
- a second plurality of photodiodes disposed in a second semiconductor wafer including a third photodiode, wherein the second plurality of photodiodes is optically aligned with the first plurality of photodiodes;
- a first interconnect layer and a second interconnect layer, wherein the first interconnect layer is disposed between the first semiconductor wafer and the second interconnect layer, wherein the second interconnect layer is disposed between the first interconnect layer and the second semiconductor wafer; and
- an optical shield disposed in the second interconnect layer, wherein the optical shield is optically aligned with the second photodiode of the first semiconductor wafer and the third photodiode of the second semiconductor wafer and prevents a portion of image light from propagating to the third photodiode.

12. The imaging system of claim 11, wherein the second plurality of photodiodes further includes a fourth photodiode optically aligned with the first photodiode, and wherein the first photodiode and the fourth photodiode absorb blue light in the image light.

13. The imaging system of claim 12, wherein the second photodiode is optically aligned with the third photodiode, and wherein the second photodiode and the third photodiode absorb red light in the image light.

14. The imaging system of claim 13, wherein the first plurality of photodiodes further includes a fifth photodiode and the second plurality of photodiodes further includes a sixth photodiode, wherein the fifth photodiode is optically aligned with the sixth photodiode, and wherein the fifth photodiode and the sixth photodiode absorb green light in the image light.

15. The imaging system of claim 14, further comprising a blue color filter optically aligned with the first photodiode, a red color filter optically aligned with the second photodiode, and a green color filter optically aligned with the fifth photodiode.

16. The imaging system of claim 11, further comprising a first control circuitry at least partially disposed in the first interconnect layer and a second control circuitry at least partially disposed in the second interconnect layer, and wherein the first control circuitry controls operation of the first plurality of photodiodes and the second control circuitry controls operation of the second plurality of photodiodes.

17. The imaging system of claim 16, further comprising a first readout circuitry at least partially disposed in the first interconnect layer and coupled to read out a first image data from the first plurality of photodiodes, and a second readout circuitry at least partially disposed in the second interconnect layer and coupled to read out a second image data from the second plurality of photodiodes.

18. The imaging system of claim 17, further comprising function logic coupled to the first readout circuitry and the second readout circuitry, wherein in response to receiving the first image data and the second image data, the function logic converts the first image data and the second image data into a data set corresponding to a high dynamic range (HDR) image.

19. The imaging system of claim 11, wherein the first semiconductor wafer and the second semiconductor wafer are bonded together at an interface of the first interconnect layer and the second interconnect layer.

20. The imaging system of claim 11, wherein the first semiconductor wafer and the first interconnect layer are a backside illuminated image sensor, and wherein the second semiconductor wafer and the second interconnect layer are a frontside illuminated image sensor.

* * * * *